United States Patent [19]
Leighton et al.

[11] Patent Number: 5,982,000
[45] Date of Patent: Nov. 9, 1999

[54] RESISTIVE INTERCONNECT OF TRANSISTOR CELLS

[75] Inventors: Larry C. Leighton, Scottsdale, Ariz.; Thomas W. Moller, Gilroy, Calif.; Nils af Ekenstam, Solna; Jan Johansson, Upplands Väsby, both of Sweden

[73] Assignee: Ericsson Inc., Morgan Hill, Calif.

[21] Appl. No.: 09/055,023

[22] Filed: Apr. 3, 1998

[51] Int. Cl.⁶ .................................................. H01L 29/78
[52] U.S. Cl. ........................................... 257/341; 252/536
[58] Field of Search ..................................... 257/341, 342, 257/903, 904, 536

[56] References Cited

U.S. PATENT DOCUMENTS

| | | | |
|---|---|---|---|
| 5,406,107 | 4/1995 | Yamaguchi | 257/904 |
| 5,536,960 | 7/1996 | Hayashi | 257/903 |

*Primary Examiner*—David B. Hardy
*Attorney, Agent, or Firm*—Lyon & Lyon LLP

[57] ABSTRACT

A plurality of transistor cells (36) formed on a semiconductor substrate (32) are connected to form a radio frequency power transistor device (30), whereby individual conductive paths (38) are formed on one side of the substrate (32) to connect respective common gate terminals (34) of adjacent transistor cells (36) in series. A further conductive path (40) is formed on an opposite side of the substrate connecting respective drain terminals (35) of the transistor cells (36) in parallel. A resistive element (42) is interposed in the conductive path (38) connecting each adjacent pair of gate terminals (34). The conductivity of the respective resistive elements (42) is selected so as to adequately provide a conductive pathway for connecting the respective gate terminal outputs, while being sufficiently resistive such that each gate terminal 34 "sees" an electrical circuit termination.

8 Claims, 2 Drawing Sheets

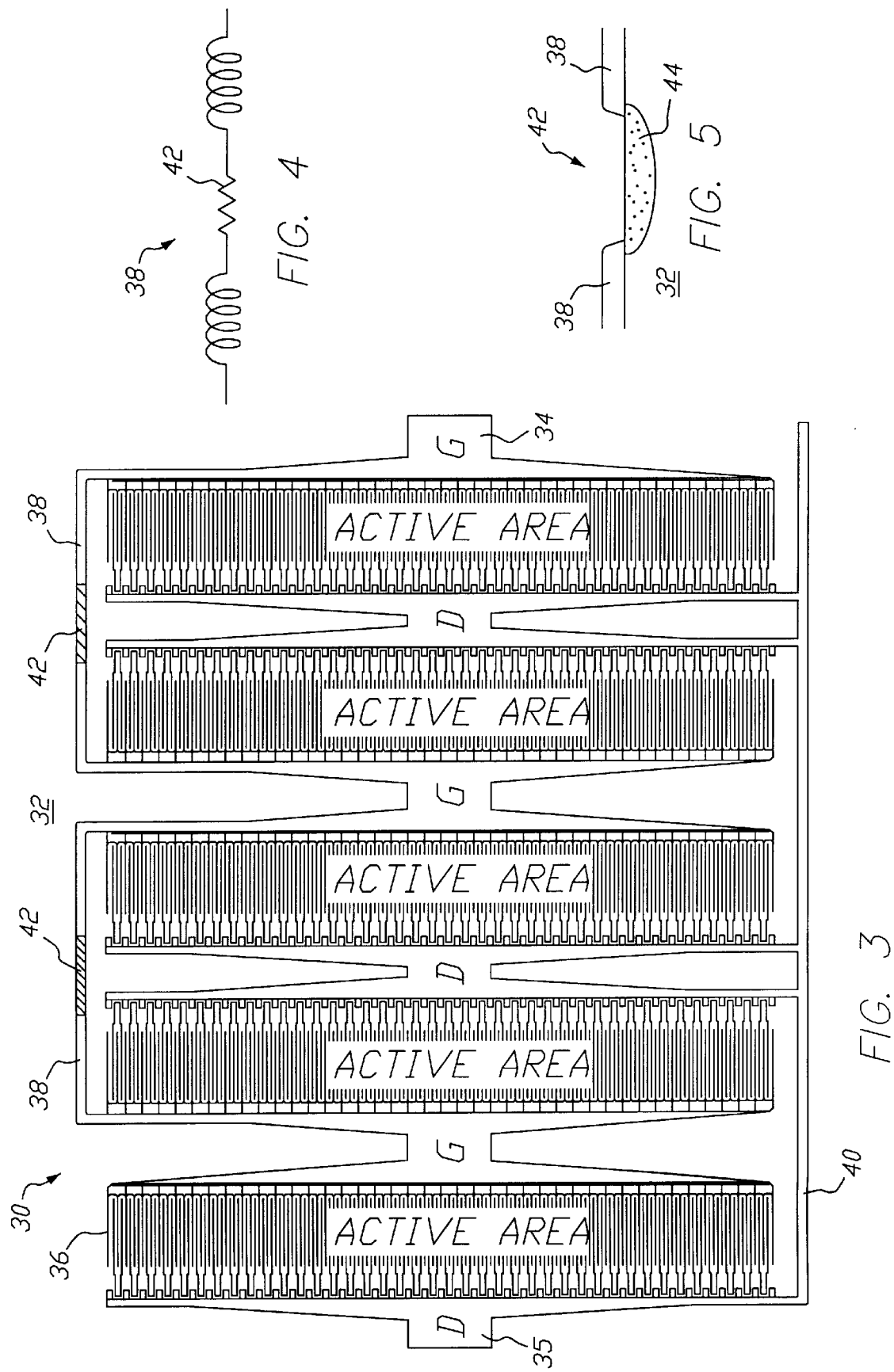

RESISTIVE INTERCONNECT OF TRANSISTOR CELLS

FIELD OF THE INVENTION

The present invention pertains to the field of power transistors and, more particularly, to the connection of multiple adjacent transistor cells in radio frequency transistor devices.

BACKGROUND

Radio frequency transistor devices may be formed by fabricating a plurality of transistor cells on a semiconductor substrate, e.g., a silicon wafer, with each transistor cell comprising a multiplicity of interdigitated transistor elements connected at common output junctions. The outputs of two or more transistor cells may then be combined to increase the overall power output of the device.

For example, FIG. 1 depicts a radio frequency MOSFET device 10 is formed on a silicon die 12 by connecting the gate terminals 14 and drain terminals 15 of adjacent transistor cells 16 formed on the die 12.

In particular, the transistor cells 16 are successively formed in an alternating, "mirror image" relationship, such that every cell 16 shares either a common gate terminal 14 or common drain terminal 15 with the next adjacent transistor cell 16. Individual conductive paths 18 are formed on one side of the die 12, connecting the respective common gate terminals 14 of each adjacent transistor cell pair, such that all of the gate terminals 14 are connected in series. A further conductive path 20 is formed on an opposite side of the die 12, connecting the respective drain terminals 15 in parallel.

As illustrated in FIG. 2, the gate terminals 14 each "see" a non-terminated impedance in the respective conductive path 18 connecting the adjacent cells 16—i.e., the relative distance of the conductive path 18 between adjacent cells 16 is effectively "infinite". This results in an undesirable push-pull effect between respective transistor cells 16, which, in turn, can cause the device 10 to oscillate and become unstable, especially as the number of interconnected transistor cells 16 is increased in order to increase the overall power output of the device 10.

It would be desirable, therefore, to provide an improved construction for the interconnection of multiple transistor cells to construct radio frequency transistor devices.

SUMMARY OF THE INVENTION

The present invention provides an improved methodology for constructing radio frequency devices with multiple interconnected of transistor cells, whereby a resistive element is interposed in the conductive path connecting respective gate terminals of adjacent transistor cells, resulting in a decreased push-pull oscillation and increased device stability.

In a preferred embodiment, a plurality of transistor cells are formed on a semiconductor substrate, e.g., a silicon die, each transistor cell comprising a multiplicity of interdigitated transistor elements connected at common output junctions.

Individual conductive paths are formed on one side of the substrate, connecting the respective gate terminals of adjacent transistor cell pairs, such that all of the gate terminals are connected in series. A further conductive path is formed on an opposite side of the substrate connecting the respective drain terminals in parallel.

A resistive element is interposed in each of the respective conductive paths connecting adjacent gate terminals, wherein the conductivity of the respective resistive elements is selected so as to adequately provide a conductive pathway for connecting the respective gate terminal outputs, while being sufficiently resistive such that each gate terminal "sees" an electrical circuit termination.

In one preferred embodiment, the conductive paths connecting the respective gate terminals are constructed by selectively etching a metal layer formed on the substrate. The resistive areas are then formed by removing a selected portion of each path and then electrically connecting the open ends of the paths via a respective diffused resistor area formed in the substrate therebetween.

BRIEF DESCRIPTION OF THE DRAWINGS

The drawings illustrate both the design and utility of the present invention, in which:

FIG. 3 is a plan view of a radio frequency transistor layout in accordance with the present invention;

FIG. 4 is a schematic representation of an electrical path between interconnected gates of adjacent transistor cells in the transistor layout of FIG. 3; and FIG. 5 is a partial side view of a preferred embodiment for forming the electrical path depicted in FIG. 4.

DETAILED DESCRIPTION OF THE PREFERRED EMBODIMENTS

Figure 1:
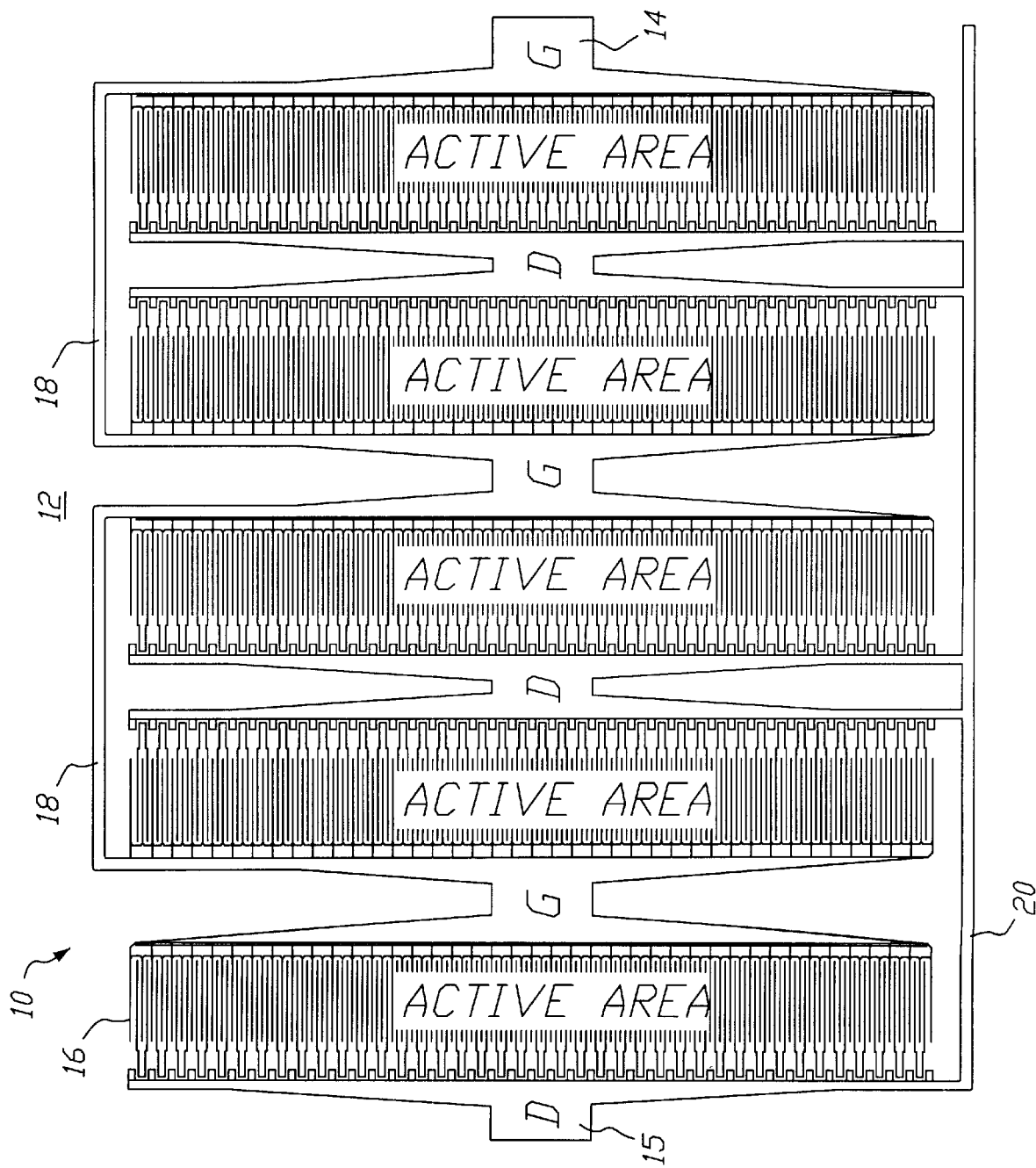
FIG. 1 is a plan view of a prior art radio frequency transistor layout, including a plurality of interconnected transistor cells.
Figure 2:
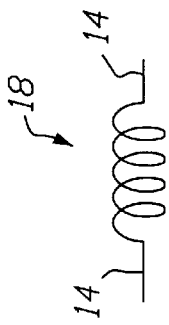
FIG. 2 is a schematic representation of an electrical path between interconnected gates of adjacent transistor cells in the transistor layout of FIG. 1.

Referring to FIG. 3, a radio frequency MOSFET device 30 is formed on a silicon die 32 by connecting the respective gate terminals 34 and drain terminals 35 of adjacent transistor cells 36 formed on the die 32. The transistor cells 36 are successively formed in an alternating, mirror image relationship, such that every cell 36 shares either a common gate terminal 34 or common drain terminal 35 with the next adjacent transistor cell 36.

Individual conductive paths 38 are formed on one side of the substrate 32, connecting the respective gate terminals 34 of adjacent transistor cell pairs, such that all of the gate terminals 34 are connected in series. A further conductive path 40 is formed on an opposite side of the substrate 32 connecting the respective drain terminals 35 in parallel.

In accordance with the present invention, a resistive element 42 is interposed in each of the respective conductive paths 38 connecting the adjacent gate terminals 34. As illustrated in FIG. 4, the conductivity of the respective resistive elements 42 is selected so as to adequately provide a conductive pathway for connecting the respective gate terminal outputs, while being sufficiently resistive such that each gate terminal 34 "sees" an electrical circuit termination.

Referring to FIG. 5, the conductive paths 38 connecting the respective gate terminals 34 may be constructed by selectively etching a metal layer formed on the substrate 32. The resistive areas 42 are then formed by removing a selected portion of the metal path 38 and then electrically connecting the open ends of the paths via a respective diffused resistor area 44 formed in the substrate 32 therebetween.

The diffused resistive areas 44 act to advantageously dissipate energy transmitted between the respective gate terminals 34, thereby damping oscillation in the device 30.

Thus, preferred embodiments have been disclosed of a resistive interconnect arrangement for connecting multiple transistor cells in an integrated circuit layout. While embodiments and applications of this invention have been shown and described, as would be apparent to those skilled in the art, many more modifications and applications are possible without departing from the inventive concepts herein.

The scope of the invention, therefore, are not to be restricted except in the spirit of the appended claims.

What is claimed:

1. A power transistor device, comprising:

first and second transistor cells formed on a semiconductor substrate, each transistor cell comprising a multiplicity of parallel transistor elements coupled to respective common gate and drain terminals; and a conductive path connecting the common gate terminal of the first transistor cell to the common gate terminal of the second transistor cell, the conductive path including a resistive region.

2. A transistor device according to claim 1, the conductive path comprising a selectively etched metal layer formed on the substrate.

3. A transistor device according to claim 2, the resistive region comprising a diffusion region in the substrate.

4. A transistor device according to claim 1, the conductive path comprising a selectively etched metal layer formed on the substrate, the resistive region comprising a diffusion region in the substrate.

5. A power transistor device, comprising:

a plurality of transistor cells formed on a semiconductor substrate, each transistor cell comprising a multiplicity of parallel transistor elements coupled to respective common gate and drain terminals, the common gate terminals of the respective transistor cells connected in series via a plurality of first conductive paths, the common drain terminals of the respective transistor cells connected in parallel via a second conductive path, each of the first conductive paths including a respective resistive region.

6. A transistor device according to claim 5, the first and second conductive paths comprising a selectively etched metal layer formed on the substrate.

7. A transistor device according to claim 5, the resistive regions each comprising a respective diffusion region in the substrate.

8. A transistor device according to claim 5, the first and second conductive paths comprising a selectively etched metal layer formed on the substrate, the resistive regions each comprising a respective diffusion region in the substrate.

* * * * *